(12) United States Patent
Buschbeck et al.

(10) Patent No.: US 6,326,632 B1
(45) Date of Patent: Dec. 4, 2001

(54) PARTICLE-OPTICAL IMAGING SYSTEM FOR LITHOGRAPHY PURPOSES

(75) Inventors: Herbert Buschbeck; Alfred Chalupka; Gertraud Lammer; Hans Loeschner, all of Vienna; Gerhard Stengl, Wernberg, all of (AT)

(73) Assignee: IMS-Ionen Mikrofabrikations Systeme GmbH, Vienna (AT)

( * ) Notice: Subject to any disclaimer, the term of this patent is extended or adjusted under 35 U.S.C. 154(b) by 0 days.

(21) Appl. No.: 09/417,633

(22) Filed: Oct. 13, 1999

(30) Foreign Application Priority Data

Oct. 13, 1998 (AT) ........................................... 1715/98

(51) Int. Cl.[7] ................ G21K 1/08; G21K 5/10; A61N 5/00
(52) U.S. Cl. ................ 250/492.21; 250/396 R; 250/492.3; 250/496.22
(58) Field of Search ............... 250/492.2, 396 R, 250/492.22

(56) References Cited

U.S. PATENT DOCUMENTS

| | | |
|---|---|---|
| 5,019,712 | 5/1991 | Knauer . |
| 5,378,917 | 1/1995 | Chalupka et al. . |
| 5,801,388 | 9/1998 | Stengl et al. . |
| 5,874,739 | 2/1999 | Buschbeck et al. . |

OTHER PUBLICATIONS

M. Szilagyi, "Electron and Ion Optics," Plenum Press, 1988; pp. 170–176.

*Primary Examiner*—Jack Berman
*Assistant Examiner*—K. Fernandez
(74) *Attorney, Agent, or Firm*—Finnegan, Henderson, Farabow, Garrett & Dunner, L.L.P.

(57) ABSTRACT

In a particle-optical imaging lithography system, an illuminating system comprising a particle source and a first electrostatic lens arrangement produces a particle beam which penetrates a mask foil provided with an orifice structure positioned in the particle beam path. This structure is imaged on a substrate plane by a projection system comprising a second electrostatic lens arrangement. The first and second lens arrangements each comprise, on their respective sides facing the mask holding device, at least one pre- and post-mask electrode, respectively. By applying different electrostatic potentials to the pre- and post-mask electrodes and to the mask foil, the mask foil and the pre-mask electrode form a grid lens with negative refracting power, and the mask foil and the post-mask electrode also form a grid lens with negative refracting power.

7 Claims, 1 Drawing Sheet

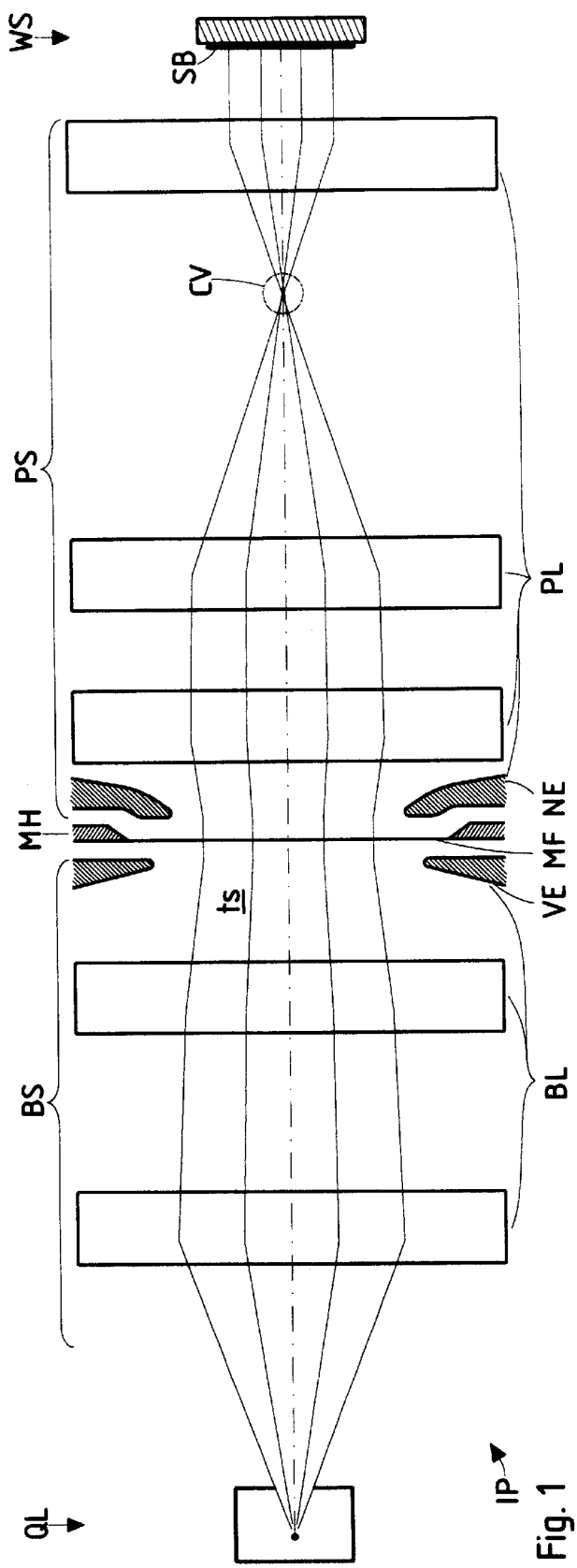

PARTICLE-OPTICAL IMAGING SYSTEM FOR LITHOGRAPHY PURPOSES

FIELD OF THE INVENTION

The invention relates to a particle-optical imaging system for lithography purposes which comprises along its optical axis:

an illuminating system having a particle source and a first electro-static lens arrangement for producing a substantially telecentric or homocentric particle beam, a mask holding device for positioning in the beam path of the particle beam a mask foil which is provided with a structure in the form of a plurality of sites, more specifically orifices, which are transparent for the particle beam and a projection system having a second electro-static lens arrangement for imaging the structure of the mask foil by means of the particle beam on an existing substrate plane wherein the second lens arrangement comprises on its side facing the mask holding device at least one post-mask electrode which is formed as an annular electrode wherein different electro-static potentials are applied to the post-mask electrode(s) and to the mask foil which functions as a control grid electrode and the mask foil together with the post-mask electrode(s) forms a control grid lens with negative refracting power.

BACKGROUND OF THE INVENTION AND DESCRIPTION OF PRIOR ART

An imaging system of this type, which is used more specifically for projection lithography methods in the semi-conductor industry is evident in WO 95/19637 (=U.S. Pat. No. 5,801,388) by the applicant.

Lithography represents an important step when structuring the semi-conductor substrates during the manufacture of semi-conductor components. The substrate, which for example can be a silicon wafer, is covered with a thin layer of light-sensitive material, a so-called photo-resist. A lithography imaging system is used to image a structure pattern onto the photo-resist; in addition to light or X-ray beams it is also possible to use particles in the form of a particle beam to expose the photo-resist. During the subsequent development step either the exposed or the non-exposed sites of the photo-resist are removed from the substrate. The substrate is then subjected to a procedural step, such as for example, etching, precipitation, oxidation, doping or the like, during which the pattern of the photo-resist on the substrate covers the particular sites of the surface which are not to be processed. After having removed the photo-resist, the substrate remains with the new structure. By repeating this sequence of steps it is possible finally to produce a succession of structure layers which form the desired semi-conductor structures, such as for example, the smallest switching circuits.

In the case of projection lithography systems which use a particle beam, stencil-like masks are used in which the patterns to be imaged are formed as orifices of an appropriate shape in a thin membrane of, for example, a few micrometers thick. The particles can only penetrate the mask orifices so that a beam pattern is produced which is projected, for example, in a reduced format on the substrate.

In addition to the ions primarily under consideration here, more specifically hydrogen ions or helium ions, it is also possible to use any other electrically charged particles including electrons a the particles for the lithography process. The advantages of using particles rather than light, are, for example, the considerably smaller wavelengths of the particles with the associated enhanced resolution and the greater depth of sharpness on the substrate.

Optical systems, regardless of whether they are light-optical or particle-optical systems, produce aberrations. It is known and general practise for particle-optical imaging systems to use electro-static lenses in the form of two or three rotationally symmetrical annular electrodes, which are formed as a tube, ring or diaphragm, where the beam passes through the middle of the said annular electrodes which lie at least partly at different electric potentials, or rather arrangements by combing such elements in rows. Lenses of this type always have a positive refracting power and are thus focussing lenses; furthermore without exception they have significant aberrations of the third order which can only be slightly influenced by the shape of the lens geometry.

By using diverging lenses (negative refracting power) it is possible to ensure that the aberrations produced by the arrangement of combined focussing lenses and diverging lenses are to a great extent compensated, the other coefficients of aberration are also maintained as small as possible. It is not possible by means of annular electrodes alone to achieve a lens of negative refracting power, such as for example from M. Szilagyi, "Electron and ion Optics", Plenum Press, 1988; on the contrary, it is necessary to use a plate or control grid electrode through which the beam passes.

EP 0 564 438 A1 (=U.S. Pat. No. 5,378,917) by the applicant discloses the use of a three-electrode lens in a particle-optical imaging system, wherein the three-electrode lens consists of two tube electrodes, between which there is located a control grid electrode so that the lens is divided by the control grid into two regions which are of different refracting power. In particular, one region can have a positive refracting power and the other can have a negative refracting power with a lower absolute value than the refracting power of the region with the positive refracting power, so that overall a lens which has a focussing effect is produced. The aberrations of the diverging region can be used to compensate for the aberrations of the focussing regions. By designing such a control grid lens in an appropriate manner it is possible to ensure that the electrical field strengths on both sides of the control grid electrode are equal with respect to their value and direction, as a result of which imaging interference, relating to the so-called aperture lens or fly's eyes effect, through the control grid orifices is avoided. Control grid lenses are, however, encumbered with the disadvantage that on the one hand the control grid is extremely thin but overall must have a large surface area and therefore is extremely sensitive to damage, all the more considering that the irradiation by particles, in particular ions, represents a considerable loading for the control grid. On the other hand, in order to avoid imaging interference it is necessary for the control grid to be moved sufficiently rapidly by a value equal at least to the width of one control grid cross piece in its plane and the requirement to maintain the precise position of the control grid in one plane places particularly high demands on the motion mechanics. It is therefore expensive to manufacture such a control grid lens and the control grid must be regularly inspected and maintained during use.

It follows from this that it is proposed in the above mentioned WO 95/19637 by the applicant that the control grid of the control grid lens is achieved by the mask foil itself which forms the middle electrode or the first electrode in the beam direction of the control grid lens. The mask foil formed in this manner comprises, likewise as is the case in EP 0 564 438 A1, the control grid lens a region of positive refracting power and a negative refracting power, the absolute value of the negative refracting power, however, being less than the positive refracting power, so that the total refracting power of the three-electrode lens is positive, i.e., focussing.

For the sake of simplicity reference is made to DE 197 34 059 A1 (=U.S. Pat. No. 08/914,070) by the applicant which discloses an arrangement for performing a shadow lithography method were a diverging lens is used as part of the illuminating system for the mask. In a preferred embodiment the mask itself forms the control grid of the diverging lens. In this shadow arrangement no projection system is provided downstream of the mask; on the contrary the substrate is disposed immediately behind the mask and the structures of the mask are imaged directly on the substrate. For this reason, owing to the lack of an optical system between the mask and the substrate the lithography arrangement of DE 197 34 059 A1 is to be regarded as not being of the same generic type as the subject matter of the present invention.

It is possible to achieve extraordinary image qualities both with respect to the resolution and also to the lack of distortion with the two embodiments described in WO 95/19637—mask as middle electrode or as a first electrode of a control grid lens. However, there is the disadvantage that the field strengths upstream and downstream of the mask are fairly different, so that a resulting force is produced which leads to a curvature of the thin mask foil. A further disadvantage resides in the fact that in both embodiments the mask is illuminated by a divergent beam of ions. In order to prevent the particles from inadmissibly scattering on the mask foil, which would cause image interference, the cross-section of the mask orifices through the foil must be tailored to suit the divergence of the beam. This means a complicated method of producing the mask which considerably increases the costs of such a system.

It is therefore an object of the invention to avoid these advantages which occur in an imaging system which uses an illuminating system and a projection system and at the same time to improve further the imaging characteristics, more specifically for the aberrations in the magnitude of 25×25 mm$^2$ in the case of particle current strengths in the magnitude of 3 $\mu$A to achieve resolutions below 100 nm.

SUMMARY OF THE INVENTION

The object is achieved by an imaging system of the type mentioned in the introduction, in which in accordance with the invention the first lens arrangement comprises on its side facing the mask holding device at least one pre-mask electrode formed as an annular electrode to which can be applied an electrical potential which is different from the potential of at least of the mask foil and which together with the mask foil forms a control grid lens which has a negative refracting power.

This solution uses the mask in two ways as a control grid electrode and the non-uniformity of the illuminating system on the one hand and aberrations of the projection system on the other hand can be compensated in each case by means of a diverging lens.

One advantageous embodiment of the invention is an ion-optical imaging system with an ion source as the particle source. Owing to their extremely short wavelengths ions render it possible to achieve particularly high resolutions of the imaged structures, and a high intensity of sharpness.

In optical imaging systems the source illuminating the object, in this case the mask structures, is imaged in the region between the object and the image of the object. For the case of a point-shaped source and an error-free imaging system the image of the source is also a point, i.e. all beams cross at this point. In a system where imaging errors (aberrations) occur, instead of a crossing point a crossing region, a so-called crossover" is used, in which the beam cross-section becomes a minimum. Owing to the repelling effect between charged particles randomly distributed impacts between the particles occur in the beam which lead to a "blurring" of the image point (so-called "stochastic" unsharpness in the image). Since the current density is greatest in the crossover, the most impacts occur at this site: the narrower the beam cross-section in the crossover, the greater the stochastic unsharpness in the image at a predetermined current strength. For this reason, in the event that the beam path comprises in the region of the projection system a crossing point with the optical axis, it is furthermore favourable if the crossing point can be adjusted by adjusting the lens parameters. The design of the crossover can render it possible to achieve a further reduction in the aberrations and also to reduce the size of the projection system in a convenient manner.

In an advantageous manner the crossing point with the optical axis for the further outwards-lying beam parts is shifted with respect to the beam parts in the proximity of the axis along the optical axis. When the crossover is achieved in such a manner as an "aberrated crossover", the stochastic error is reduced. The crossing point for the further outwards-lying beam parts with respect to the beam parts in the proximity of the axis can be shifted away from the substrate plane or from the mask foil.

In a further advantageous embodiment the field strengths are substantially equal in value at least in the region of the illumination by the particle beam on both sides of the mask foil, which avoids the electrical field having a dynamic effect on the mask electrode.

BRIEF DESCRIPTION OF THE DRAWINGS

The invention is explained in detail hereinunder with reference to an exemplified embodiment which is illustrated in the attached drawings, in which:

FIG. 1 shows a schematic lateral view of an imaging system in accordance with the invention, FIG. 2 shows an enlarged section of FIG. 1 which illustrates the crossover region.

DETAILED DESCRIPTION OF THE INVENTION

The imaging system IP illustrated in FIG. 1 serves to produce a structure pattern on a substrate SB by projecting the structures located on a mask foil MF using an ion beam ts. The structures of the mask foil MF are imaged advantageously in a reduced format on the substrate SB. The ions of the ion beam are emitted by an ion source QL which comprises a sufficiently small virtual source size (e.g. 10 $\mu$m). The ions being emitted from the source QL are focused by means of an illuminating system BL in a homocentric, advantageously telecentric, ion beam.

The ion beam ts illuminates the mask. The mask foil MF comprises a structure pattern in the form of one or a plurality of orifices and/or other sites which are transparent for the particle beam and which are formed on the foil according to the structure pattern to be produced on the substrate. The mask foil MF is positioned on a mask holding device MH at the required position in the beam path of the ion beam. In the main, the mask holding device MH is part of a mask station which comprises a number of masks, for example, for sequential illuminating steps. The mask foil MF allows the ion beam ts to pass only through the sites of the mask orifices and thus transfers its structure pattern to the ion beam.

The ion beam exiting the mask is projected by a projection system PS disposed downstream of the mask foil MF, onto the substrate SB. The substrate SB, which is, for example, a silicon wafer with a photo-resist layer, is aligned by means of a wafer station WS with respect to the ion beam and to the desired illuminating field on the wafer. The projection system PS produces as plane as possible an image of the mask structures in the proximity of the Gaussian image plane; the wafer station WS positions the wafer SB or its surface to be illuminated so close to the image plane that the fewest possible aberrations occur at this site.

The illuminating system BS and likewise the projection system PS comprise in each case a lens arrangement, BL, PL, formed by a succession of annular electrodes that in each case produce one or a plurality of electrostatic focusing lenses. Electro-static focusing lenses are well known to the person skilled in the art for use in an illuminating or projection system and for this reason, whilst referring to the documents already mentioned, no further details will be provided. The illuminating system BS is, with the exception of its last annular electrode VE, illustrated in FIG. 1 in a simplified manner by means of rectangles which symbolize the focusing lens system BL of the illuminating system BS. Likewise for the projection system PS, the system of focusing electro-static lenses PL is only illustrated as symbolic rectangles, with the exception of the first annular electrode NE downstream of the mask.

In accordance with the invention, the mask foil MF acts in two ways as a control grid electrode in each case of a lens with a negative refracting power, namely on the one hand in conjunction with one or a plurality of annular electrodes VE of the illuminating system BS for correcting the lens errors of the illuminating optics and on the other hand in conjunction with one or a plurality of annular electrodes NE of the projection system PS for enhancing the imaging characteristics of the projection system. By using the mask in two ways as a control grid lens it is possible to exploit the favourable characteristics of the diverging effect of the control grid lenses for both optical systems of the illumination and projection process.

The invention is based on the knowledge that the refracting regions on both sides of the mask foil MF which acts as a control grid electrode can be used independently of each other as diverging lenses, unlike as was hitherto the case of designing them as parts of a control grid lens which comprises at least one annular electrode upstream of the control grid, the control grid (i.e., the mask) itself and at least on annular electrode downstream of the control grid.

In the exemplifies embodiment illustrated in FIG. 1, the electrode VE, next to the mask, of the illuminating system BS functions together with the mask foil MF as a diverging mask lens to achieve a greater angular homogeneity of the illumination of the mask structures to be imaged on the wafer SB. This electrode is called the "pre-mask electrode" as it is positioned in the beam direction directly upstream of the mask.

In the known exemplified embodiment, an electrical potential is applied to the pre-mask electrode VE, which potential is selected with respect to the potential of the mask foil MF such that the ions accelerate as they approach the mask foil MF, this produces the desired diverging effect, i.e., negative refracting power, for a control grid lens, which is formed from an annular electrode and a downstream control grid electrode. Moreover, it is also possible to provide instead of a single annular electrode a plurality of annular electrodes to which suitable electrical potentials can be applied and which exert overall a diverging effect on the ion beam and serve in such a manner as pre-mask electrodes of a mask lens to enhance the optical characteristics of the illuminating system BS.

As a result of the lens errors of focussing lenses, an illuminating system BS which consists of focussing lenses and which produces a substantially telecentric ion beam ts has the characteristic that, for example, although the beams in the proximity of the axis are parallel to the optical axis, the beams remote from the axis are somewhat convergent. In the outer regions of the mask this would lead to shadow effects owing to the light passing through the structure orifices in an inclined manner; one feature for avoiding these shadow effects, namely the production of structure orifices which are inclined accordingly with respect to the axis is extremely expensive from the technology point of view. An additional front diverging lense VE, MF disposed downstream of the focussing lens arrangement can render it possible to correct these errors and the excessive convergence of the beams remote from the axis can be compensated. As a consequence the region of angular homogeneity, in which the ion beam ts illuminating the mask can be regarded as sufficiently axis parallel, can be expanded over at least the entire structure field of the mask.

Simultaneously, the mask foil MF forms together with the foremost annular electrodes NE of the projection system PS a second diverging lens which renders it possible to adjust the imaging characteristics of the projection system in a more favorable manner. These electrodes, which immediately follow the mask as seen in the beam direction, are described here as "post-mask electrodes". In the exemplified embodiment illustrated in FIG. 1, for example, only one post-mask electrode is provided.

The diverging effect of the lens formed by the mask foil MF and the post-mask electrodes NE is achieved by virtue of the fact that different electro-static potentials are applied to the post-mask electrodes and the mask foil MF acting as a control grid electrode, wherein an accelerating effect is exerted on the ion beam after it has passed through the mask. This is produced in comparison to the front diverging lense VE, MF owing to the opposing curvature of the potential surfaces in the region of this lense MF, NE.

Since the ion beam ts is telecentric, i.e., almost axis parallel, as it passes through the mask, the diverging effect of the second mask lens MF, NE causes the ion beam to diverge as it enters the arrangement of focussing lenses of the projection system PS. It is possible to adjust the position of the crossover CV in the axial direction in a more convenient manner with the aid of the diverging lens. At the same time, the sharpness, i.e. the spatial expansion, of the crossover can be controlled in accordance with the invention by using the second diverging lens.

In the exemplified embodiment illustrated, the crossover is adjusted to the extent that an "aberrated" crossover is produced which, as is illustrated in FIG. 2, is distributed over a region on the optical axis and in which the crossing point for beams ns in the proximity of the axis is shifted in the direction towards the substrate and for the beams ds remote from the axis is displaced at an increasing rate away from the substrate SB in the direction of the mask. As a consequence, the stochastic error is reduced as a result of the considerably reduced space-charge density in the crossover region CV.

By chancing the potentials at the two diverging lenses, however, it can also be ensured that the crossing point for further outwards-lying beams ties closer to the substrate than the crossing point of the beams in the proximity of the axis. This feature can, for example, reduce the image curvature aberration. The "aberrated" crossover is adjusted in response to any other such aberrations which are to be corrected, such as, for example, the image curvature aberration.

The presence of a greatly aberrated crossover CV can lead to a corresponding distortion of the image of the mask structures on the substrate. Insofar as this is not compensated by the imaging characteristics of the projection system including its aberrations, the image distortions can be corrected in an advantageous manner by means of corresponding corrections in the arrangement of the structures in the mask itself. By taking into consideration the image distortion in the mask structures, it is possible to comply more easily with the demands made on the imaging system with respect to other aberrations, such as for example, the stochastic unsharpness already mentioned, or the chromatic unsharpness or an image curvature aberration.

As is evident from the aforegoing, in the exemplified embodiment mentioned, the electrical potential increases on both sides of the mask. In other variants of the embodiment, the diverging effect upstream of the mask can be produced by virtue of the fact that the field strength upstream of the mask is delayed; this is then the case if the beam coming from the illuminating system is in the first place divergent. In an advantageous manner, the values of the electrical field strengths on both sides of the mask foil MF can be adjusted so as to be substantially equal or at least only slightly different. As a consequence, it is possible to avoid a complete force effect on the mask foil MF which, owing to its small thickness, would curve in the direction of the prevailing force and thus would cause changes in the position of the mask foil structures.

If the field strengths on both sides of the mask foil MF are different, then the aperture lens effect already mentioned occurs at the sites of the mask orifices. This can be counteracted by virtue of the fact that owing to the different potentials and the shape of the pre- and post-mask electrodes the differences in the field strengths on the mask foil are minor. Aperture lens effects of the mask orifices are, however, in this respect of less importance than the mask itself which is the subject to be imaged through the projection system PS and thus a point of the mask itself is imaged on the corresponding image point in the substrate plane SB in the case of a small deflection of the ion beam ts being emitted from this point.

What is claimed is:

1. A particle-optical imaging system for lithography comprising along its optical axis:

an illuminating system having a particle source and a first electro-static lens arrangement for producing a particle beam chosen from a substantially telecentric and substantially homocentric particle beam;

a mask holding device for positioning a mask foil in the beam path of the particle beam, the mask foil being provided with a structure in the form of a plurality of sites that are transparent to the particle beam; and a projection system having a second electro-static lens arrangement for imaging the structure of the mask foil by means of the particle beam on a substrate plane, wherein the second lens arrangement comprises at least one post-mask electrode on a side of the second lens arrangement facing the mask holding device, the at least one post-mask electrode being in the form of an annular electrode, and wherein different electrostatic potentials can be applied to the post-mask electrode and to the mask foil, the mask foil functioning as a control grid electrode, and the mask foil together with the at least one post-mask electrode forming a control grid lens having negative refracting power, and further wherein the first lens arrangement comprises at least one pre-mask, electrode on a side of the first lens arrangement facing the mask holding device, at least one pre-mask electrode being in the form of an annular electrode, and wherein different electro-static potentials can be applied to the pre-mask electrode and to the mask foil, the at least one pre-mask electrode together with the mask foil forming a control grid lens having a negative refracting power.

2. The imaging system according to claim 1, wherein the system comprises an ion-optical imaging system comprising an ion source as a particle source.

3. The imaging system according to claim 1, wherein the beam path in the region of the projection system comprises a crossing point with the optical axis and the crossing point with the optical axis is shifted for further outwards-lying beam parts with respect to beam parts in the proximity of the axis along the optical axis.

4. The imaging system according to claim 3, wherein the crossing point with the optical axis for the further outwards-lying beam parts is shifted with respect to the beam parts in the proximity of the axis away from the substrate plane.

5. The imaging system according to claim 3, wherein the crossing point with the optical axis is shifted for the further outwards-lying beam parts with respect to the beam parts in the proximity of the axis of the mask foil.

6. The imaging system according to claim 1, wherein the field strengths at least in the region of the illumination by the particle beam are aligned on both sides of the mask foil in an opposing manner but have substantially equal values.

7. The imaging system according to claim 1, wherein the field strengths are directed in the same direction at least in the region of the illumination by the particle beam on both sides of the mask foil and have substantially equal values.

* * * * *

UNITED STATES PATENT AND TRADEMARK OFFICE
CERTIFICATE OF CORRECTION

PATENT NO. : 6,326,632 B1
DATED : December 4, 2001
INVENTOR(S) : Herbert Buschbeck et al.

It is certified that error appears in the above-identified patent and that said Letters Patent is hereby corrected as shown below:

<u>Column 8,</u>
Line 23, replace "one pre-mask, electrode" with -- one pre-mask electrode --;
Line 24, insert -- the -- after "holding device,".

Signed and Sealed this

Twenty-first Day of May, 2002

Attest:

JAMES E. ROGAN
*Attesting Officer*     *Director of the United States Patent and Trademark Office*